United States Patent
Wan et al.

(10) Patent No.: US 11,677,035 B2
(45) Date of Patent: Jun. 13, 2023

(54) METHOD FOR MANUFACTURING A SENSING DEVICE

(71) Applicant: InnoLux Corporation, Miao-Li County (TW)

(72) Inventors: Wei-Lin Wan, Miao-Li County (TW); Yu-Tsung Liu, Miao-Li County (TW); Ming-Chih Chen, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 17/545,184

(22) Filed: Dec. 8, 2021

(65) Prior Publication Data

US 2022/0216351 A1    Jul. 7, 2022

(30) Foreign Application Priority Data

Jan. 7, 2021    (CN) .......................... 202110017770.7

(51) Int. Cl.
*H01L 31/0216*    (2014.01)
*H01L 31/18*    (2006.01)

(52) U.S. Cl.
CPC .... *H01L 31/02164* (2013.01); *H01L 31/1868* (2013.01)

(58) Field of Classification Search
CPC ........... H01L 31/02164; H01L 31/1868; H01L 31/02162; H01L 31/02327; H01L 27/14683; H01L 27/1462; H01L 27/14623; H01L 27/14645; H01L 27/14685; G06V 40/1318
See application file for complete search history.

(56) References Cited

U.S. PATENT DOCUMENTS

| | | | | |
|---|---|---|---|---|
| 5,100,822 A | * | 3/1992 | Mitani | ................. H01L 29/945 257/E27.092 |
| 2018/0151120 A1 | * | 5/2018 | Kim | ..................... G09G 3/3258 |
| 2018/0329078 A1 | * | 11/2018 | Shahar | ...................... G01T 1/16 |
| 2021/0334500 A1 | | 10/2021 | Huang | |
| 2022/0293657 A1 | * | 9/2022 | Chou | ............... H01L 27/14627 |

FOREIGN PATENT DOCUMENTS

| | | |
|---|---|---|
| CN | 111325193 A | 6/2020 |
| KR | 100238922 B1 * | 1/2000 |

OTHER PUBLICATIONS

Kim HK, Cho CK. Transparent SiON/Ag/SiON multilayer passivation grown on a flexible polyethersulfone substrate using a continuous roll-to-roll sputtering system. Nanoscale Res Lett. Jan. 5, 2012;7(1):69. doi: 10.1186/1556-276X-7-69. PMID: 22221400; PMCID: PMC3275511. (Year: 2012).*

* cited by examiner

*Primary Examiner* — Sitaramarao S Yechuri
(74) *Attorney, Agent, or Firm* — McClure, Qualey & Rodack, LLP

(57) ABSTRACT

A method for manufacturing a sensing device is provided. The method includes: providing a substrate; forming a sensing unit on the substrate; forming a first light-shielding layer on the sensing unit; forming a first anti-reflection layer on the sensing unit; and patterning the first light-shielding layer and the first anti-reflection layer using a single lithography process to form a first pinhole corresponding to the sensing unit.

20 Claims, 6 Drawing Sheets

METHOD FOR MANUFACTURING A SENSING DEVICE

CROSS REFERENCE TO RELATED APPLICATIONS

This application claims the benefit of China Application No. 202110017770.7, filed Jan. 7, 2021, the entirety of which is incorporated by reference herein.

BACKGROUND

Technical Field

The present disclosure is related to a method for manufacturing a sensing device, and in particular it is related to a method for manufacturing a sensing device including a light-shielding layer and an anti-reflection layer.

Description of the Related Art

Optical sensing devices are widely used in consumer electronics such as smartphones and wearable devices etc., and have become indispensable necessities in modern society. With the flourishing development of such consumer electronics, consumers have high expectations regarding the quality, functionality, or price of these products.

A pinhole array is often used in imaging of optical systems, and it can be combined with optical elements to make the imaging clearer. In recent years, it has also been used in optical sensing devices. However, the current shielding materials used in pinhole arrays have problems such as low light transmittance, difficulty in alignment, and difficulty in miniaturizing pinhole sizes. These problems also affect the applicability of the product.

Therefore, the development of a manufacturing method or structural design that can improve the performance or reliability of the pinhole array applied to the sensing device is still currently an important research topic in the industry.

SUMMARY

In accordance with some embodiments of the present disclosure, a method for manufacturing a sensing device is provided. The method includes: providing a substrate; forming a sensing unit on the substrate; forming a first light-shielding layer on the sensing unit; forming a first anti-reflection layer on the sensing unit; and patterning the first light-shielding layer and the first anti-reflection layer using a single lithography process to form a first pinhole corresponding to the sensing unit.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1:
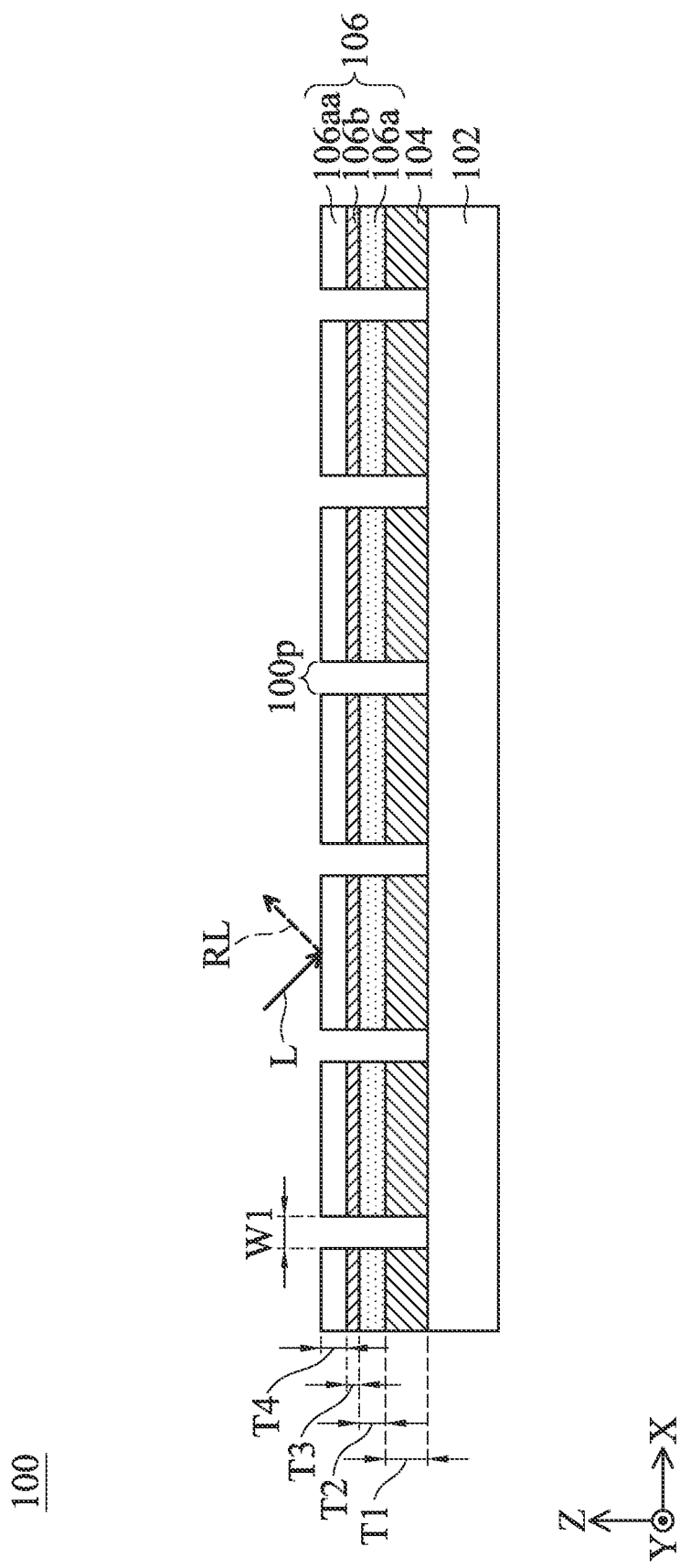
FIG. 1 is a cross-sectional diagram of a sensing device in accordance with some embodiments of the present disclosure.

The sensing device and the method for manufacturing the sensing device of the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on/over a second material layer", may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on/over the second material layer" means that the first material layer is in direct contact with the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. Accordingly, the first element in the specification may refer to the second element in the claims.

In accordance with the embodiments of the present disclosure, regarding the terms such as "connected", "interconnected", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected" or "electrically coupled" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The stated value of the present disclosure is an approximate value. When there is no specific description, the stated value includes the meaning of "about" or "substantially". The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, a method for manufacturing a sensing device is provided, in which a light-shielding layer and an anti-reflection layer can be patterned to form pinholes using a single lithography process, thereby alleviating the problem of alignment errors, which is advantageous to the miniaturization of pinholes. Furthermore, in accordance with some embodiments of the present disclosure, the optical structure of the sensing device can achieve an effective anti-reflection effect in a specific wavelength range. In accordance with some embodiments of the present disclosure, the sensing device may be a biometric recognition device, such as a fingerprint recognition device, but it is not limited thereto.

Refer to FIG. 1, which is a cross-sectional diagram of an optical structure 100 in accordance with some embodiments of the present disclosure. Furthermore, the present disclosure also provides a method for manufacturing an optical structure. The optical structure 100 as shown in FIG. 1 can be formed by such a method. The detailed structure of the optical structure 100 will be described below in combination with the method for manufacturing the optical structure. It should be understood that, in accordance with some embodiments, additional steps may be added before, during, and/or after the following manufacturing method of the optical structure, or some steps may be replaced or omitted.

First, a sensing layer 102 is provided. In some embodiments, the sensing layer 102 may include a substrate, driving elements, related circuits, signal lines, sensing elements, etc. . . . which will be further described in FIG. 3. In some embodiments, the substrate may include a flexible substrate, a rigid substrate, or a combination thereof, but it is not limited thereto. In some embodiments, the material of the substrate may include glass, quartz, sapphire, ceramic, polyimide (PI), polycarbonate (PC), polyethylene terephthalate (PET), polypropylene (PP), other suitable materials or a combination thereof, but it is not limited thereto. Furthermore, in some embodiments, the substrate may include a metal-glass fiber composite plate, or a metal-ceramic composite, but is not limited thereto. In addition, the light transmittance of the substrate is not limited. That is, the substrate may be a light-transmitting substrate, a semi-transmitting substrate, or a non-transmitting substrate.

Next, a light-shielding layer 104 is formed on the sensing layer 102. The light-shielding layer 104 may have a thickness T1. In some embodiments, the thickness T1 of the light-shielding layer 104 may be between 1000 Å and 3000 Å (i.e. 1000 Å≤thickness T1≤3000 Å), or between 1500 Å and 3000 Å, for example, 2000 Å or 2500 Å. In accordance with the embodiments of the present disclosure, the thickness T1 refers to the maximum thickness of the light-shielding layer 104 in a normal direction of the substrate of the sensing layer 102 (for example, the Z direction in the drawing).

It should be understood that, in accordance with the embodiments of the present disclosure, an optical microscope (OM), a scanning electron microscope (SEM), a film thickness profiler (α-step), an ellipsometer or other suitable methods may be used to measure the thickness, width or height of the element, or the distance or pitch between elements. Specifically, in some embodiments, a scanning electron microscope may be used to obtain a cross-sectional image including the elements to be measured, and the thickness, width or height of the element, or the distance or pitch between elements in the image can be measured.

The light-shielding layer 104 may include a metal material. The metal material may include copper (Cu), aluminum (Al), molybdenum (Mo), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), alloys of the above metal materials, other suitable metal materials or a combination thereof, but it is not limited thereto.

Furthermore, in some embodiments, the light-shielding layer 104 is formed on the sensing layer 102 by a chemical vapor deposition process, a physical vapor deposition process, an electroplating process, an electroless plating process, other suitable processes, or a combination thereof. The chemical vapor deposition process may include, for example, a low pressure chemical vapor deposition process (LPCVD), a low temperature chemical vapor deposition process (LTCVD), a rapid thermal chemical vapor deposition process (RTCVD), a plasma enhanced chemical vapor deposition process (PECVD), or an atomic layer deposition (ALD), but it is not limited thereto. The physical vapor deposition process may include, for example, a sputtering process, an evaporation process, a pulsed laser deposition, etc., but it is not limited thereto.

Next, an anti-reflection layer 106 is formed on the light-shielding layer 104. Specifically, in some embodiments, the step of forming the anti-reflection layer 106 includes sequentially forming an insulating layer 106a on the light-shielding layer 104, forming a metal layer 106b on the insulating layer 106a, and forming an insulating layer 106aa on the metal layer 106b.

As shown in FIG. 1, the insulating layer 106a has a thickness T2, the metal layer 106b has a thickness T3, and the insulating layer 106aa has a thickness T4. In some embodiments, the thickness T2 of the insulating layer 106a may be between 500 Å and 1000 Å (i.e. 500 Å≤thickness T2≤1000 Å), or between 600 Å and 900 Å, for example, 700 Å or 800 Å. In some embodiments, the thickness T3 of the metal layer 106b may be between 40 Å and 200 Å (i.e. 40 Å≤thickness T3≤200 Å), or between 40 Å and 160 Å, for example, 50 Å, 60 Å, 70 Å, 80 Å, 90 Å, 100 Å, 110 Å, 120 Å, 130 Å, 140 Å, or 150 Å. In some embodiments, the thickness T4 of the insulating layer 106aa may be between 500 Å and 1000 Å (i.e. 500 Å≤thickness T4≤1000 Å), or between 600 Å and 900 Å, for example, 700 Å or 800 Å.

In some embodiments, the thickness T2 of the insulating layer 106a is greater than the thickness T3 of the metal layer 106b. In some embodiments, the thickness T4 of the insulating layer 106aa is greater than the thickness T3 of the metal layer 106b. Furthermore, the thickness T4 of the insulating layer 106aa may be the same as or different from the thickness T2 of the insulating layer 106a. In accordance with the embodiments of the present disclosure, the thickness T2, the thickness T3, and the thickness T4 respectively refer to the maximum thickness of the insulating layer 106a, the metal layer 106b, and the insulating layer 106aa in the normal direction of the substrate of the sensing layer 102 (for example, the Z direction in the drawing).

It should be noted that the insulating layer 106a, the metal layer 106b, and the insulating layer 106aa with a specific thickness range can effectively reduce the reflectivity and achieve an anti-reflection effect. As shown in FIG. 1, a significantly reduced reflected light RL is generated after a light L passed through the anti-reflection layer 106.

The materials of the insulating layer 106a and the insulating layer 106aa may include an inorganic insulating material or an organic insulating material. In some embodiments, the inorganic insulating material may include silicon nitride, silicon oxide, silicon oxynitride, aluminum oxide, other suitable materials, or a combination thereof, but it is not limited thereto. In some embodiments, the organic insulating material may include perfluoroalkoxy alkane (PFA), polytetrafluoroethylene (PTFE), fluorinated ethylene propylene (FEP), ethylene, other suitable materials or a combination thereof, but it is not limited thereto. Furthermore, the material of the insulating layer 106a may be the same as or different from the material of the insulating layer 106aa.

In some embodiments, the material of the metal layer 106b may include copper (Cu), aluminum (Al), molybdenum (Mo), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), alloys of the above metal materials, other suitable metal materials or a combination thereof, but it is not limited thereto. The material of the light-shielding layer 104 may be the same as or different from the material of the metal layer 106b.

In some embodiments, the insulating layer 106a, the metal layer 106b, and the insulating layer 106aa may be sequentially formed on the light-shielding layer 104 by a chemical vapor deposition process, a physical vapor deposition process, an electroplating process, an electroless plating process, a coating process, a printing process, other suitable processes, or a combination thereof.

Furthermore, it should be understood that although the drawings only illustrate the embodiment in which the anti-reflection layer 106 is formed on the light-shielding layer 104, the light-shielding layer 104 may also be formed on the anti-reflection layer 106, or the light-shielding layer 104 may be formed between two anti-reflection layers 106 in accordance with some other embodiments.

In addition, the light-shielding layer 104 and the anti-reflection layer 106 are patterned using a single lithography process to form a pinhole 100p. In other words, parts of the light-shielding layer 104 and the anti-reflection layer 106 (including the insulating layer 106a, the metal layer 106b, and the insulating layer 106aa) are removed by the same lithography process to form the pinhole 100p. In some embodiments, the pinhole 100p penetrates the light-shielding layer 104 and the anti-reflection layer 106, and exposes a top surface of a substrate SUB.

It should be noted that the light-shielding layer 104 and the anti-reflection layer 106 are patterned using a single lithography process to form pinholes 100p, so that the pinholes 10000p that are formed have self-aligned characteristics. Therefore, the problem of alignment errors can be reduced, or it is advantageous to the miniaturization of the pinholes 100p.

Specifically, the pinhole 100p has a width W1. In some embodiments, the width W1 of the pinhole 100p may be between 1 micrometer (μm) and 20 μm (i.e. 1 μm≤width W1≤20 μm), or between 1 μm and 15 μm, or between 1 μm and 10 μm, for example, 2 μm, 3 μm, 4 μm, 5 μm, 6 μm, 7 μm, 8 μm, or 9 μm. In accordance with the embodiments of the present disclosure, the width W1 refers to the maximum width of the bottom of the pinhole 100p in a direction perpendicular to the normal direction of the substrate of the sensing layer 102 (for example, the X direction in the drawing).

In some embodiments, the lithography process may include a photolithography process and an etching process. The photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

Furthermore, the aforementioned "the light-shielding layer 104 and the anti-reflection layer 106 are patterned to form pinholes 100p using a single lithography process" means that the light-shielding layer 104 and the anti-reflection layer 106 use the same mask for the photolithography process. As for the subsequent etching process, according to the materials of the light-shielding layer 104 and the anti-reflection layer 106, a dry etching process and a wet etching process can be selectively combined and used to form pinholes 100p in the light-shielding layer 104 and the anti-reflection layer 106. For example, after a mask is used for a photolithography process to form a patterned photoresist on the anti-reflection layer 106, the light-shielding layer 104 can be patterned by a dry etching process, and then the anti-reflection layer 106 can be patterned by a wet etching process to form pinholes 100p in the light-shielding layer 104 and the anti-reflection layer 106, but it is not limited thereto. For example, in some embodiments, different etching gases may be used in a dry etching process, or different etchant solutions may be used in a wet etching process to pattern the anti-reflection layer 106 and the light-shielding layer 104. In some embodiments, the light-shielding layer 104 may be patterned by a wet etching process, and then the anti-reflection layer 106 may be patterned by a dry etching process.

Figure 2A:
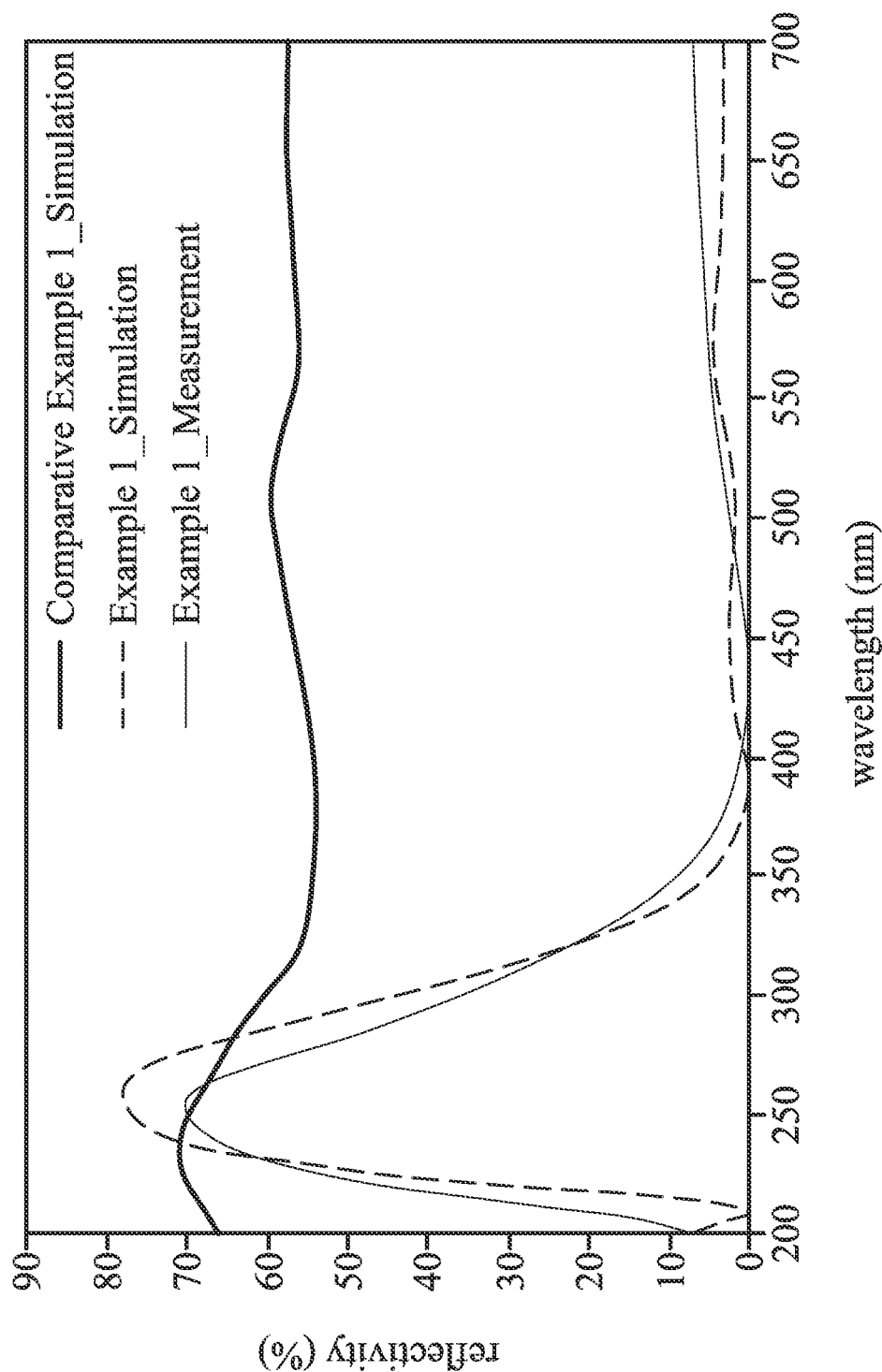
FIG. 2A is a diagram showing the simulation results and measurement results of the reflectivity of an optical structure in accordance with some embodiments of the present disclosure.

Next, refer to FIG. 2A, which is a diagram showing the simulation results and measurement results of the reflectivity of an optical structure in accordance with some embodiments of the present disclosure. Comparative Example 1_Simulation and Example 1_Simulation are optical simulation results. Comparative Example 1 represents an optical structure having only the sensing layer 102 and the light-shielding layer 104 (formed of molybdenum and containing a pinhole structure), and Example 1 represents an optical structure including the sensing layer 102, the light-shielding layer 104 and the anti-reflection layer 106 (as shown in FIG. 1). In addition, Example 1_Measurement is the result of an optical structure including the sensing layer 102, the light-shielding layer 104 and the anti-reflection layer 106 (as shown in FIG. 1) obtained by the measurement of the UV-visible light spectrophotometer CARY300.

As shown in FIG. 2A, compared to the optical structure having only the sensing layer 102 and the light-shielding layer 104 (Comparative Example 1_simulation), the optical structure including the sensing layer 102, the light-shielding layer 104, and the anti-reflection layer 106 of the Examples according to the present disclosure (the results of both optical simulation (Example 1_Simulation) and actual measurement (Example 1-_Measurement)) has a decreased reflectivity in a wavelength range of about 400 nanometers (nm) to about 700 nanometers. For example, the reflectivity is decreased by about 50% to 70%.

Figure 2B:
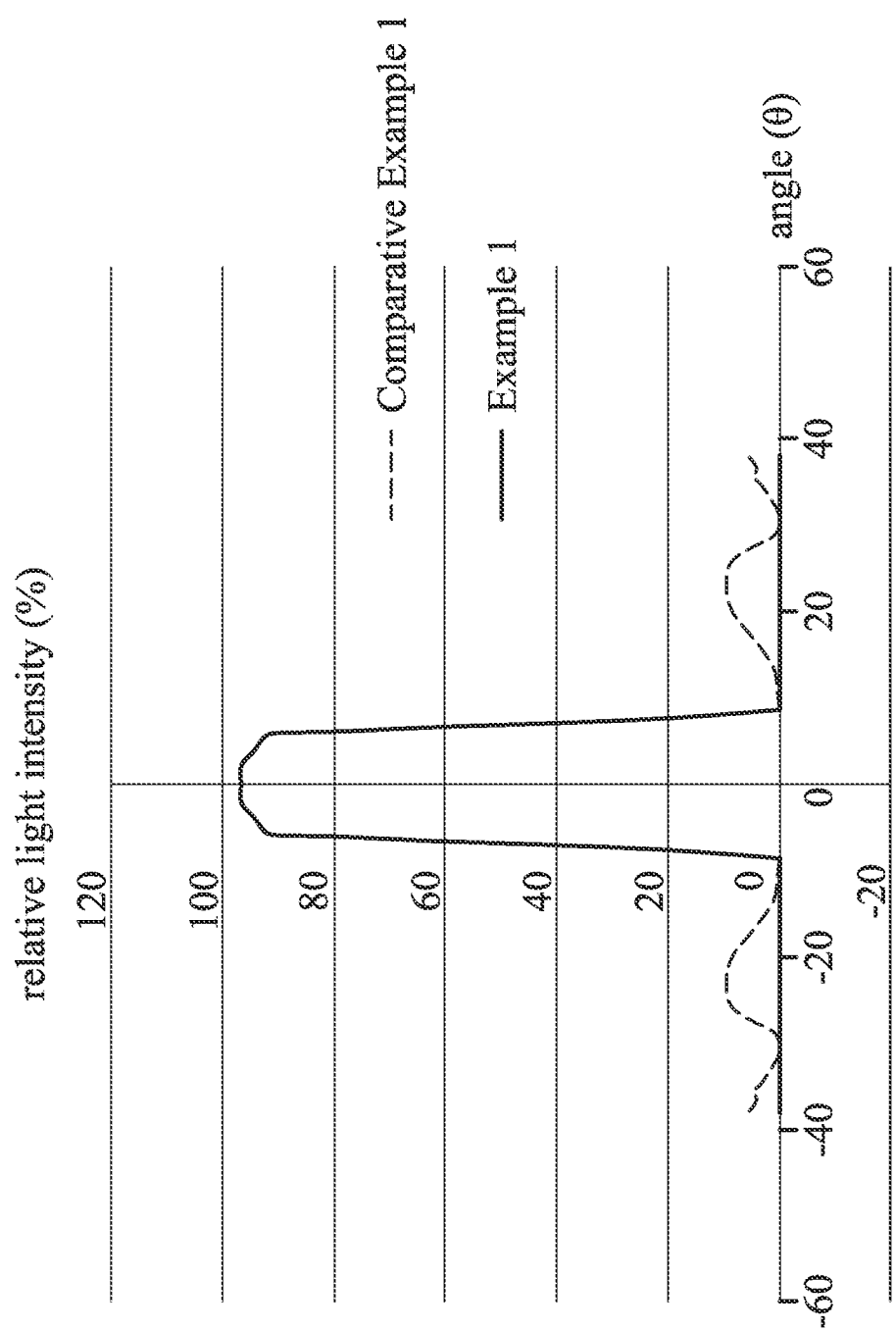
FIG. 2B is a diagram showing the relationship between the intensity of the reflected light of an optical structure and the field of view in accordance with some embodiments of the present disclosure.

Refer to FIG. 2B, which is a diagram showing the relationship between the intensity of the reflected light of an optical structure and the field of view in accordance with some embodiments of the present disclosure. The horizontal axis angle of 0 degrees represents the viewing angle perpendicular to the surface of the substrate of the sensing layer 102 (that is, the vertical viewing angle), and the horizontal axis angle of 20 degrees/−20 degrees represents the viewing angle deviated from the vertical viewing angle by 20 degrees/−20 degrees. The definition of other horizontal axis angles is the same, and thus will not be repeated herein. The vertical axis represents the relative light intensity of the reflected light, and its value is a normalized result taking the measured maximum light intensity of the reflected light being 100%.

As shown in FIG. 2B, compared to the optical structure of Comparative Example 1 (indicated by a dotted line, the dotted line segment between about 10 degrees and about −10 degrees is covered by the line segment of Example 1), the optical structure of Example 1 can reduce the interference of reflected light from large angles.

In accordance with the embodiments of the present disclosure, "reflectivity" refers to the percentage of the intensity of the reflected light from the light source divided by the intensity of the incident light from the light source (for example, including ambient light, such as the light emitted by a measuring instrument). In accordance with the embodiments of the present disclosure, "light intensity" refers to the integral value of the light spectrum. Furthermore, the light source includes, for example, visible light (e.g., the wavelength is between 380 nm and 780 nm, or between 400 nm and 700 nm).

In accordance with some embodiments, a spectrophotometer or other instrument that can measure reflectivity may be used to measure the reflectivity and light intensity of the optical structure. In addition, the reflectivity is obtained in a measurement mode of Specular Component Included (SCI), which includes the measurement of specular reflection and diffuse reflection.

Figure 3:
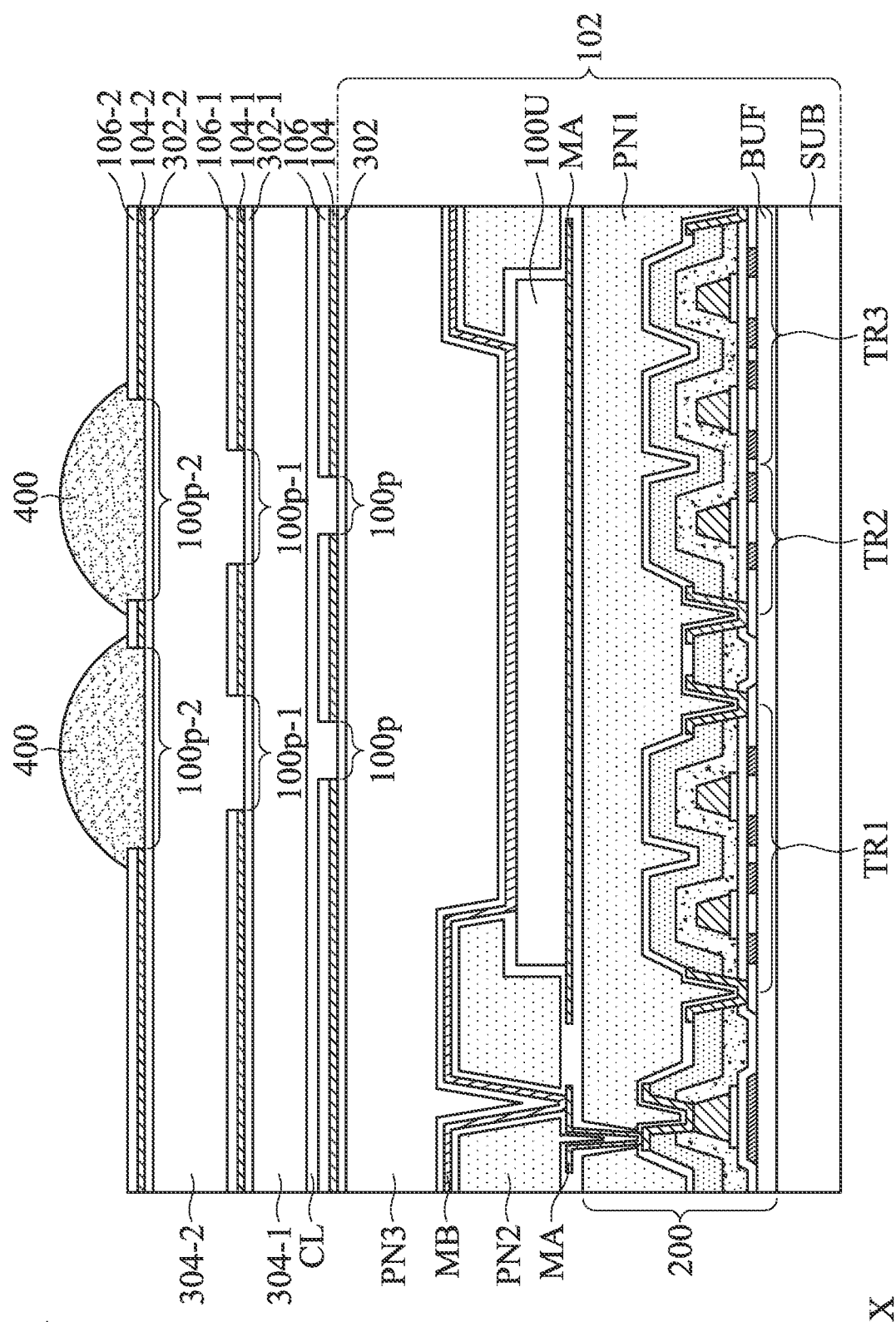
FIG. 3 is a cross-sectional diagram of a sensing device in accordance with some embodiments of the present disclosure.

Next, refer to FIG. 3, which is a cross-sectional diagram of a sensing device 10 in accordance with some embodiments of the present disclosure. It should be understood that, for clarity of description, some elements of the sensing device 10 may be omitted in the figure, and only some elements are schematically shown. In accordance with some embodiments, additional features can be added to the sensing device 10 described below. In accordance with some other embodiments, some of the features of the sensing device 10 described below may be replaced or omitted.

FIG. 3 is a schematic structural diagram where the optical structure 100 as shown in FIG. 1 is integrated in the sensing device 10. Furthermore, a method for manufacturing a sensing device is also provided in the present disclosure. The method can be used to form the sensing device 10 as shown in FIG. 3. The detailed structure of the sensing device 10 will be described below in conjunction with the method for manufacturing the sensing device. It should be understood that, in accordance with some embodiments, additional steps may be added before, during, and/or after the following manufacturing method of the sensing device, or some steps may be replaced or omitted. Furthermore, the same or similar components (or elements) in the following paragraph will be denoted by the same or similar reference numbers, and their materials, manufacturing methods and functions are the same or similar to those described above, and thus they will not be repeated in the following context.

First, a substrate SUB is provided. A sensing unit 100U is then formed on the substrate SUB. In some embodiments, the sensing unit 100U can receive light and convert it into an electrical signal. In some embodiments, the sensing unit 100U may include a photodiode, other components that can convert optical signals to electrical signals, or a combination thereof, but it is not limited thereto.

Specifically, in some embodiments, the sensing unit 100U is formed of a semiconductor material. The semiconductor material includes, for example, silicon, germanium, indium gallium arsenide (InGaAs), other suitable semiconductor materials, or a combination thereof. Furthermore, the semiconductor material is doped to have different conductivity characteristics. For example, in some embodiments, the sensing unit 100U may have a P-N structure or a P-I-N structure, but it is not limited thereto. In some embodiments, the sensing unit 100U is electrically connected to a driving layer 200 disposed on the substrate SUB.

Referring to FIG. 3, the driving layer 200 is formed on the substrate SUB. In some embodiments, a buffer layer BUF is formed between the substrate SUB and the driving layer 200. In some embodiments, the driving layer 200 may include thin-film transistors, such as the thin-film transistors TR1, TR2, and TR3 shown in the figure, and the driving layer 200 may include conductive elements or signal lines electrically connected to the thin-film transistors, the insulating layers formed between the conductive elements and the planarization layer etc. In some embodiments, the signal lines may include, for example, a current signal line, a voltage signal line, a high-frequency signal line, or a low-frequency signal line, and the signal line can transmit device operating voltage (VDD) or common ground voltage (VSS), or drive the terminal voltage of device, but the present disclosure is not limited thereto.

In some embodiments, thin-film transistors may include switching transistors, driving transistors, reset transistors, transistor amplifiers, or other thin-film transistors. Specifically, in some embodiments, the thin-film transistor TR1 is a reset transistor, the thin-film transistor TR2 is a transistor amplifier or a source follower, and the thin-film transistor TR3 is a switching transistor, but it is not limited thereto. However, the number of thin-film transistors is not limited to that shown in the figure. According to different embodiments, the sensing device 10 may have other suitable numbers or types of thin-film transistors. Furthermore, the types of thin-film transistors may include top gate thin-film transistors, bottom gate thin-film transistors, dual gate or double gate thin-film transistors, or a combination thereof. In some embodiments, the thin-film transistor may be further electrically connected to a capacitor element, but it is not limited thereto.

In addition, each thin-film transistor may include at least one semiconductor layer, a gate dielectric layer, and a gate electrode layer. The semiconductor layer may include amorphous silicon, polycrystalline silicon, or metal oxide. The materials of the semiconductor layer contained in different thin-film transistors may be the same or different. The thin-film transistor can exist in various forms well known to those skilled in the art, and the detailed structure of the thin-film transistor will not be repeated herein.

As shown in FIG. 3, in some embodiments, a planarization layer PN1 is formed on the thin-film transistors, and a planarization layer PN2 is formed on the planarization layer PN1 and cover both sides of the sensing unit 100U. Furthermore, in some embodiments, the thin-film transistors are electrically connected to the sensing unit 100U through a conductive layer MA and a conductive layer MB. In detail, the conductive layer MA may penetrate through other conductive layers (not labeled) and be electrically connected to the thin-film transistors in the driving layer 200. In addition, the conductive layer MA may penetrate through the planarization layer PN1 and be electrically connected to the conductive layer MB. The conductive layer MB may penetrate through the planarization layer PN2 and be electrically connected to the sensing unit 100U. In some embodiments, the portion of the conductive layer MA passing through the planarization layer PN1 and the portion of the conductive layer MB passing through the planarization layer PN2 serve as via structures.

In some embodiments, the materials of the planarization layer PN1 and the planarization layer PN2 may include organic materials, inorganic materials, other suitable materials, or a combination thereof, but they are not limited thereto. For example, the inorganic material may include, but is not limited to, silicon nitride, silicon oxide, silicon oxynitride, aluminum oxide, other suitable materials, or a combination thereof. For example, the organic material may include, but is not limited to, epoxy resins, silicone resins, acrylic resins such as polymethylmetacrylate (PMMA), polyimide, perfluoroalkoxy alkane (PFA), other suitable materials or a combination thereof.

In some embodiments, the planarization layer PN1 and the planarization layer PN2 may be formed by a chemical vapor deposition process, a physical vapor deposition process, a coating process, a printing process, other suitable processes, or a combination thereof.

In some embodiments, the conductive layer MA and the conductive layer MB may include conductive materials, such as metal conductive materials, transparent conductive materials, other suitable conductive materials, or a combination thereof, but they are not limited thereto. The metal conductive material may include, for example, copper (Cu), silver (Ag), gold (Au), tin (Sn), aluminum (Al), molybdenum (Mo), tungsten (W), chromium (Cr), nickel (Ni), platinum (Pt), titanium (Ti), alloys of the foregoing metals, other suitable materials, or a combination thereof, but it is not limited thereto. The transparent conductive material may include transparent conductive oxide (TCO), for example, indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), other suitable transparent conductive materials, or a combination thereof, but it is not limited thereto. In some embodiments, the material of the conductive layer MB is a transparent conductive material.

In some embodiments, the conductive layer MA and the conductive layer MB may be formed by a chemical vapor deposition process, a physical vapor deposition process, an electroplating process, an electroless plating process, other suitable processes, or a combination thereof.

Referring to FIG. 3, in some embodiments, a planarization layer PN3 is formed on the sensing unit 100U, and then a passivation layer 302 is formed on the planarization layer PN3. The material and method for forming the planarization layer PN3 are similar to those of the planarization layer PN1, and thus will not be repeated here.

In some embodiments, the passivation layer 302 may include an inorganic material, an organic material, or a combination thereof, but it is not limited thereto. For example, the inorganic material may include, but is not limited to, silicon nitride, silicon oxide, silicon oxynitride, other suitable materials, or a combination thereof. For example, the organic material may include, but is not limited to, polyethylene terephthalate (PET), polyethylene (PE), polyethersulfone (PES), polycarbonate (PC), polymethylmethacrylate (PMMA), polyimide (PI), other suitable materials, or a combination thereof.

In some embodiments, the passivation layer 302 may be formed by a chemical vapor deposition process, a physical vapor deposition process, a coating process, a printing process, other suitable processes, or a combination thereof.

In some embodiments, the light-shielding layer 104 and the anti-reflection layer 106 are formed on the sensing unit 100U. As described above, the light-shielding layer 104 is formed on the sensing unit 100U first, and then the anti-reflection layer 106 is formed on the light-shielding layer 104, and the light-shielding layer 104 and the anti-reflection layer 106 are patterned using a single lithography process to form pinholes 100p corresponding to the sensing unit 100U. Specifically, in some embodiments. "the pinhole 100p corresponds to the sensing unit 100U" means that in the normal direction of the substrate SUB (for example, the Z direction in the drawing), the pinhole 100p at least partially or entirely overlaps the sensing unit 100U.

It should be understood that although the drawings only illustrate the embodiment in which the anti-reflection layer 106 is formed on the light-shielding layer 104, the light-shielding layer 104 may also be formed on the anti-reflection layer 106 in accordance with some other embodiments. Alternatively, two anti-reflection layers 106 may be formed, and the two anti-reflection layers 106 may be respectively formed above the light-shielding layer 104 and below the light-shielding layer 104.

Furthermore, the material and method for forming the light-shielding layer 104 and the anti-reflection layer 106 can refer to the related description of FIG. 1, and thus will not be repeated here.

As shown in FIG. 3, in some embodiments, a color filter layer CL is formed on the anti-reflection layer 106, and the color filter layer CL is formed in the pinholes 100p. In some embodiments, the color filter layer CL may include a green filter unit. In some embodiments, the color filter layer CL may include a red filter unit, a blue filter unit, a white filter unit, or other color filter units, but it is not limited thereto. According to different embodiments, the color filter layer CL may have any suitable number or color of color filter units.

In some embodiments, the material of the color filter layer CL may include a color photoresist, and the material of the color photoresist, for example, may include a polymer material and pigments and photosensitive materials dispersed therein. In some embodiments, the aforementioned polymer material may include epoxy resins, acrylic resins such as polymethylmetacrylate (PMMA), benzocyclobutene (BCB), other suitable materials, or a combination thereof, but it is not limited thereto.

In some embodiments, the color filter CL may be formed by a coating process, a chemical vapor deposition process, a physical vapor deposition process, a printing process, an evaporation process, a sputtering process, other suitable processes, or a combination thereof.

As shown in FIG. 3, in some embodiments, a dielectric layer 304-1 is then formed on the color filter layer CL. In some embodiments, the dielectric layer 304-1 may also have a planarized surface.

In some embodiments, the material of the dielectric layer 304-1 may include an organic dielectric material or an inorganic dielectric material. For example, the organic insulating material may include, but is not limited to, perfluoroalkoxy alkane (PFA), polytetrafluoroethylene (PTFE), fluorinated ethylene propylene (FEP), polyethylene, others suitable materials or a combination thereof. For example, the inorganic insulating material may include, but is not limited to, silicon oxide, silicon nitride, silicon oxynitride, or a combination thereof.

In some embodiments, the dielectric layer 304-1 may be formed by a coating process, a chemical vapor deposition process, a physical vapor deposition process, a printing process, an evaporation process, a sputtering process, other suitable processes, or a combination thereof.

In addition, in some embodiments, the sensing device 10 further includes more than one optical structure. For example, a light-shielding layer 104-1 may be further formed on the anti-reflection layer 106, and an anti-reflection layer 106-1 may be formed on the light-shielding layer 104-1. The light-shielding layer 104-1 and the anti-reflection layer 106-1 may be patterned using a single lithography process to form pinholes 100p-1. As shown in FIG. 3, in some embodiments, the pinhole 100p-1 may overlap the pinhole 100p in the normal direction of the substrate SUB (for example, the Z direction in the drawing).

Specifically, in some embodiments, the passivation layer 302-1 is formed on the dielectric layer 304-1 first, and then the light-shielding layer 104-1 and the anti-reflection layer 106-1 are sequentially formed on the passivation layer 302-1. In some embodiments, the width (not labeled) of the pinhole 100p-1 is greater than the width (not labeled) of the pinhole 100p.

It should be noted that, in some embodiments, since the anti-reflection layer 106 is formed on the light-shielding layer 104, the problem of reflected light being reflected back and forth between the metal layer 104-1 and the metal layer 104 can be reduced. The noise signals of light may be reduced.

In addition, in some embodiments, a dielectric layer 304-2 is further formed on the anti-reflection layer 106-1, and the dielectric layer 304-2 is filled in the pinholes 100p-1. In some embodiments, the dielectric layer 304-2 may also have a planarized surface. In some embodiments, a passivation layer 302-2 is then formed on the dielectric layer 304-2.

The materials and methods for forming the dielectric layer 304-2 and the passivation layer 302-2 are similar to those of the dielectric layer 304-1 and the passivation layer 302-1, and thus will not be repeated here.

In some embodiments, another light-shielding layer 104-2 is further formed on the passivation layer 302-2, and an anti-reflection layer 106-2 is formed on the light-shielding layer 104-2. The light-shielding layer 104-2 and the anti-reflection layer 106-2 may be patterned using a single lithography process to form pinholes 100p-2. As shown in FIG. 3, in some embodiments, the pinhole 100p-2 may overlap the pinhole 100p-1 and the pinhole 100p in the normal direction of the substrate SUB (for example, the Z direction in the drawing). In some embodiments, the width (not labeled) of the pinhole 100p-2 is greater than the width (not labeled) of the pinhole 100p-1.

It should be understood that although the sensing device 10 shown in the drawing has three layers of optical structures (i.e. three light-shielding layers and three anti-reflection layers), the number of the optical structures can be adjusted according to needs in accordance with various embodiments, and the present disclosure is not limited thereto.

Still referring to FIG. 3, in some embodiments, light collector units 400 are further formed on the anti-reflection layer 106-2. In some embodiments, the light collector unit 400 may include a micro-lens structure, other structures having the effect of collecting light, or a combination thereof, but it is not limited thereto.

Figure 4:
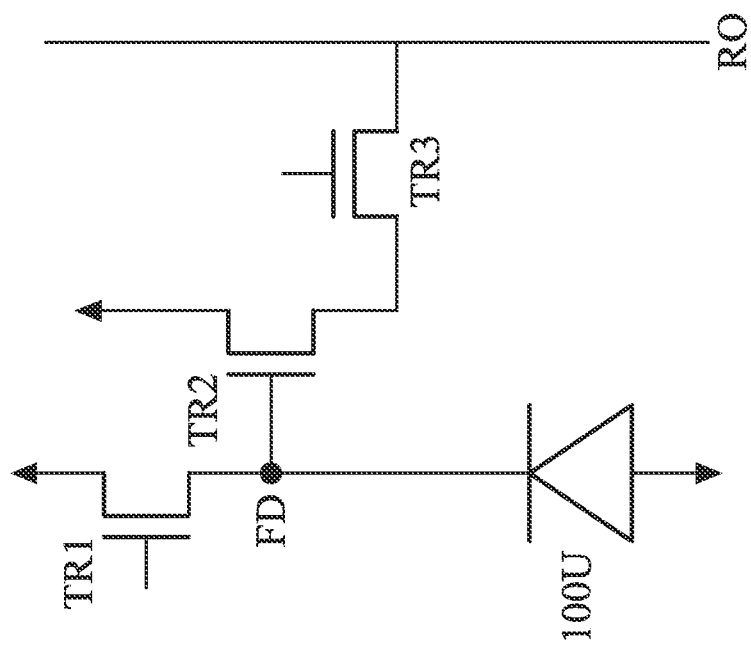
FIG. 4 is an equivalent circuit diagram of a sensing device in accordance with some embodiments of the present disclosure.

Next, refer to FIG. 4, which is an equivalent circuit diagram of some elements of the sensing device 10 in accordance with some embodiments of the present disclosure. As shown in FIG. 4, in some embodiments, the thin-film transistor TR1 and the thin-film transistor TR2 are connected to a node FD, the thin-film transistor TR2 is further connected to the thin-film transistor TR3, and the sensing unit 100U is connected to the node FD. In some embodiments, the thin-film transistor TR1 can reset the potential of the node FD to give an initial potential, and the photocurrent generated by the sensing unit 100U can change the potential of the node FD, and the thin-film transistor TR2 can provide current to the thin-film transistor TR3 in response to the change in the potential of the node FD. Then, the aforementioned current can be transmitted to a readout line RO by turning on the thin-film transistor TR3, the readout line RO can be further electrically connected to a processor, and the signals are processed by the processor.

As described above, in accordance with some embodiments of the present disclosure, the optical structure 100 having the light-shielding layer 104 and the anti-reflection layer 106 can replace the black matrix photoresist material as an optical element that reduces the light reflectivity. Therefore, problems such as difficulty in alignment or miniaturization due to low transmittance of the black matrix photoresist can be reduced.

Figure 5:
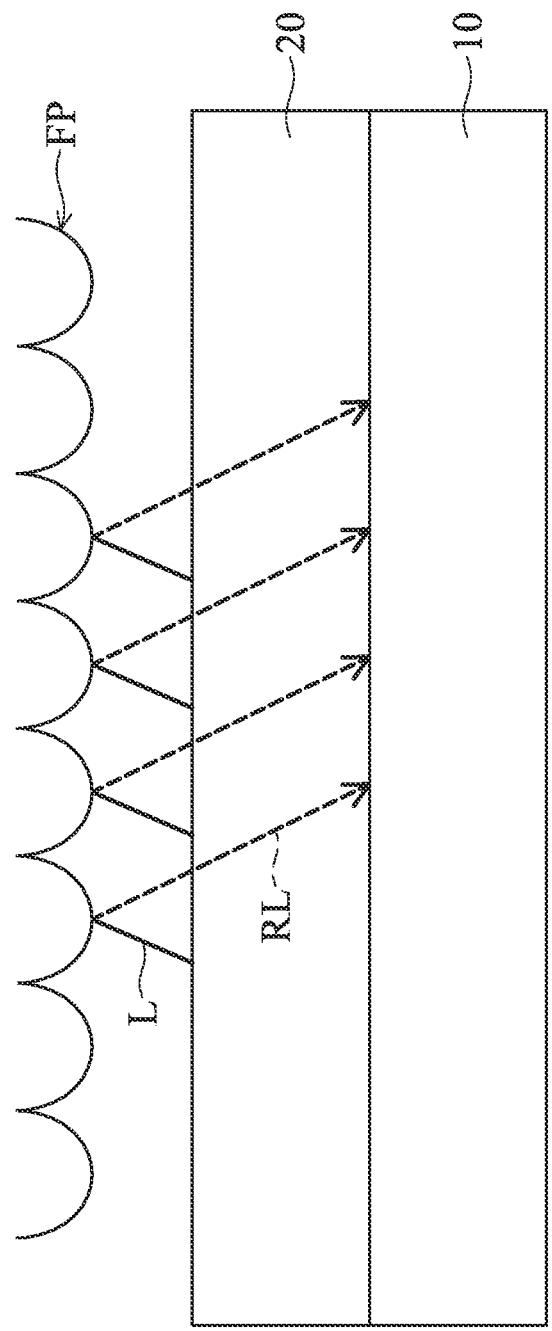
FIG. 5 is a schematic diagram of an electronic device in accordance with some embodiments of the present disclosure.

Refer to FIG. 5, which is a schematic diagram of an electronic device 1 in accordance with some embodiments of the present disclosure. It should be understood that, for clarity of description, the drawings only schematically illustrate part of the components of the electronic device 1. In accordance with some embodiments, additional features can be added to the electronic device 1 described below.

In some embodiments, the electronic device 1 includes the aforementioned sensing device 10 and a display panel 20, and the display panel 20 is disposed on the sensing device 10. In some embodiments, the electronic device 1 has functions such as touch-sensing or fingerprint recognition. For example, the electronic device 1 may be a touch display device, but it is not limited thereto. For example, the light L generated by the display panel 20 is reflected by a finger FP to generate the reflected light RL, and the reflected light RL can be transmitted to the sensing device 10 after passing through the display panel 20. The sensing device 10 can sense the touch of the finger, and convert it into an electronic signal to the corresponding driving component or signal processing component for identification and analysis.

In some embodiments, the display panel 20 may include, for example, a liquid-crystal display panel, a light-emitting diode display panel, such as an inorganic light-emitting diode display panel, an organic light-emitting diode (OLED) display panel, a mini light-emitting diode (mini LED) display panel, a micro LED display panel, or a quantum dot (QD) light-emitting diode (e.g., QLED or QDLED) display panel, but it is not limited thereto.

In addition, in some embodiments of the present disclosure, the aforementioned optical structure 100 can be applied to display devices in addition to sensing devices. It can replace black matrix materials and be formed on the wirings of driving elements to improve the light reflection problem of the display device.

To summarize the above, in accordance with some embodiments of the present disclosure, the method for manufacturing the sensing device can have the light-shielding layer and the anti-reflection layer be patterned in a single lithography process to form pinholes. Therefore, the problem of alignment errors can be reduced, or it is advantageous to the miniaturization of the pinholes. Furthermore, in accordance with some embodiments of the present disclosure, the optical structure of the sensing device has an effective anti-reflection effect in a specific wavelength range.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods or steps. In addition, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A method for manufacturing a sensing device, comprising:
   providing a substrate;
   forming a sensing unit on the substrate;
   forming a planarization layer on the sensing unit;
   forming a passivation layer on the planarization layer;
   forming a first light-shielding layer on the sensing unit;
   forming a first anti-reflection layer on the sensing unit; and
   patterning the first light-shielding layer and the first anti-reflection layer using a single lithography process to form a first pinhole corresponding to the sensing unit, wherein the pinhole penetrates the first light-shielding layer and the first anti-reflection layer, and exposes a top surface of the passivation layer.

2. The method for manufacturing the sensing device as claimed in claim 1, wherein a width of the first pinhole is between 1 µm and 20 µm.

3. The method for manufacturing the sensing device as claimed in claim 1, wherein the step of forming the first anti-reflection layer comprises:
   forming a first insulating layer;
   forming a metal layer on the first insulating layer; and
   forming a second insulating layer on the metal layer.

4. The method for manufacturing the sensing device as claimed in claim 3, wherein a thickness of the first insulating layer is greater than a thickness of the metal layer.

5. The method for manufacturing the sensing device as claimed in claim 3, wherein a thickness of the first insulating layer is between 500 angstroms and 1000 angstroms.

6. The method for manufacturing the sensing device as claimed in claim 3, wherein a thickness of the second insulating layer is between 500 angstroms and 1000 angstroms.

7. The method for manufacturing the sensing device as claimed in claim 3, wherein a thickness of the metal layer is between 40 angstroms and 200 angstroms.

8. The method for manufacturing the sensing device as claimed in claim 7, wherein the thickness of the metal layer is between 40 angstroms and 160 angstroms.

9. The method for manufacturing the sensing device as claimed in claim 1, wherein the first anti-reflection layer is formed on the first light-shielding layer.

10. The method for manufacturing the sensing device as claimed in claim 1, further comprising:
    forming a light collector unit on the first anti-reflection layer.

11. The method for manufacturing the sensing device as claimed in claim 1, wherein a thickness of the first light-shielding layer is between 1000 angstroms and 3000 angstroms.

12. The method for manufacturing the sensing device as claimed in claim 1, wherein in the step of patterning the first light-shielding layer and the first anti-reflection layer using the single lithography process to form the first pinhole, a same mask is used to pattern the first light-shielding layer and the first anti-reflection layer.

13. The method for manufacturing the sensing device as claimed in claim 1, wherein after the step of patterning the first light-shielding layer and the first anti-reflection layer to form the first pinhole, further comprises:
    forming a color filter layer on the first anti-reflection layer, wherein the color filter layer is formed in the first pinhole.

14. The method for manufacturing the sensing device as claimed in claim 1, further comprising:

forming a second light-shielding layer on the first anti-reflection layer;

forming a second anti-reflection layer on the first anti-reflection layer; and patterning the second light-shielding layer and the second anti-reflection layer using a single lithography process to form a second pinhole, wherein the second pinhole overlaps the first pinhole in a normal direction of the substrate.

15. The method for manufacturing the sensing device as claimed in claim 14, wherein a width of the second pinhole is greater than a width of the first pinhole.

16. The method for manufacturing the sensing device as claimed in claim 14, wherein the second anti-reflection layer is formed on the second light-shielding layer.

17. The method for manufacturing the sensing device as claimed in claim 14, further comprising:

forming a third light-shielding layer on the second anti-reflection layer;

forming a third anti-reflection layer on the second anti-reflection layer; and patterning the third light-shielding layer and the third anti-reflection layer using a single lithography process to form a third pinhole, wherein the third pinhole overlaps the second pinhole in the normal direction of the substrate.

18. The method for manufacturing the sensing device as claimed in claim 17, wherein a width of the third pinhole is greater than a width of the second pinhole, and the third anti-reflection layer is formed on the third light-shielding layer.

19. A method for manufacturing a sensing device, comprising:

providing a substrate;

forming a sensing unit on the substrate;

forming a planarization layer on the sensing unit;

forming a passivation layer on the planarization layer;

forming a first light-shielding layer on the sensing unit;

forming a first anti-reflection layer on the sensing unit;

patterning the first light-shielding layer and the first anti-reflection layer using a single lithography process to form a first pinhole corresponding to the sensing unit; and forming a light collector unit on the first anti-reflection layer.

20. A method for manufacturing a sensing device, comprising:

providing a substrate;

forming a sensing unit on the substrate;

forming a first light-shielding layer on the sensing unit;

forming a first anti-reflection layer on the sensing unit;

patterning the first light-shielding layer and the first anti-reflection layer using a single lithography process to form a first pinhole corresponding to the sensing unit; and forming a color filter layer on the first anti-reflection layer, wherein the color filter layer is formed in the first pinhole.

* * * * *